US009099339B2

(12) United States Patent
Lundberg, Jr.

(10) Patent No.: US 9,099,339 B2
(45) Date of Patent: *Aug. 4, 2015

(54) OPTICAL SIGNALING FOR A PACKAGE-ON-PACKAGE STACK

(75) Inventor: Nils Magnus Lundberg, Jr., Hollviken (SE)

(73) Assignees: Sony Corporation, Tokyo (JP); Sony Mobile Communications AB, Lund (SE)

(*) Notice: Subject to any disclaimer, the term of this patent is extended or adjusted under 35 U.S.C. 154(b) by 653 days.

This patent is subject to a terminal disclaimer.

(21) Appl. No.: 12/980,671

(22) Filed: Dec. 29, 2010

(65) Prior Publication Data

US 2011/0097036 A1 Apr. 28, 2011

Related U.S. Application Data

(63) Continuation of application No. 12/166,680, filed on Jul. 2, 2008, now Pat. No. 7,885,494.

(51) Int. Cl.

| | |
|---|---|
| ***G02B 6/00*** | (2006.01) |
| ***H01L 25/10*** | (2006.01) |
| ***G02B 6/43*** | (2006.01) |
| ***H01L 23/48*** | (2006.01) |
| ***H01L 25/18*** | (2006.01) |
| *H01L 23/31* | (2006.01) |
| *H01L 23/00* | (2006.01) |

(52) U.S. Cl.

CPC ................ *H01L 25/105* (2013.01); *G02B 6/43* (2013.01); *H01L 23/48* (2013.01); *H01L 25/18* (2013.01); *H01L 23/3128* (2013.01); *H01L 24/48* (2013.01); *H01L 2224/48225* (2013.01); *H01L 2225/06527* (2013.01); *H01L 2225/1023* (2013.01); *H01L 2225/1058* (2013.01); *H01L 2924/14* (2013.01); *H01L 2924/1433* (2013.01); *H01L 2924/15311* (2013.01); *H01L 2924/15331* (2013.01)

(58) Field of Classification Search

USPC .................................... 385/14, 16–24, 48, 50

See application file for complete search history.

(56) References Cited

U.S. PATENT DOCUMENTS

| | | | |
|---|---|---|---|
| 6,008,530 | A | 12/1999 | Kano |
| 6,093,938 | A | 7/2000 | Minemier et al. |

(Continued)

FOREIGN PATENT DOCUMENTS

| | | | |
|---|---|---|---|
| JP | 2008-103567 | | 5/2008 |
| JP | 2008103567 | A * | 5/2008 |
| WO | WO 2004/090976 | | 10/2004 |

OTHER PUBLICATIONS

Co-pending U.S. Appl. No. 12/166,680, filed Jul. 2, 2008 entitled “Optical Signaling For a Package-on-Package Stack” by Nils Magnus Lundberg, 32 pages.

(Continued)

*Primary Examiner* — Tina Wong

(74) *Attorney, Agent, or Firm* — Patrick B. Horne; Moore & Van Allen PLLC

(57) ABSTRACT

A package-on-package stack may include an upper package, an optical interface, and a lower package. The upper package may send an optical signal from a first component in the upper package. The optical interface may receive the optical signal from the upper package, and may transmit the optical signal. The lower package may receive the optical signal from the optical interface, and may relay the optical signal to a second component in the lower package or at the motherboard.

18 Claims, 8 Drawing Sheets

504-1 510-1 506-1 508-1 514-1 512-1 504-2

402

310

404

516 510-2 506-2 508-2 514-2 502 512-2

(56) References Cited

U.S. PATENT DOCUMENTS

| | | | | |
|---|---|---|---|---|
| 6,501,869 | B1 | 12/2002 | Athale | |
| 6,731,843 | B2 | 5/2004 | Murali | |
| 7,072,535 | B2 | 7/2006 | Uchida | |
| 7,376,295 | B2 | 5/2008 | Lee et al. | |
| 7,885,494 | B2 * | 2/2011 | Lundberg | 385/16 |
| 2002/0039464 | A1 | 4/2002 | Yoshimura et al. | |
| 2003/0179979 | A1 | 9/2003 | Ouchi | |
| 2004/0208438 | A1 | 10/2004 | Faris | |
| 2005/0002628 | A1 | 1/2005 | Rahman et al. | |
| 2005/0259925 | A1 | 11/2005 | Asari et al. | |
| 2006/0024060 | A1 | 2/2006 | Roth et al. | |
| 2008/0017971 | A1 | 1/2008 | Hollis | |
| 2008/0144411 | A1 | 6/2008 | Tsern | |
| 2008/0318360 | A1 | 12/2008 | Chen et al. | |
| 2009/0180733 | A1 * | 7/2009 | Hwang et al. | 385/14 |

OTHER PUBLICATIONS

Notification of Transmittal of the International Search Report and the Written Opinion of the International Searching Authority, or the Declaration corresponding to PCT/IB2008/055602, dated May 6, 2009, 16 pages.

European Patent Office; Communication Pursuant to Article 94(3) EPC; Oct. 11, 2012; issued in European Patent Application No. 08 874 870.2.

* cited by examiner

OPTICAL SIGNALING FOR A PACKAGE-ON-PACKAGE STACK

RELATED APPLICATION

This application is a continuation of U.S. patent application Ser. No. 12/166,680 filed Jul. 2, 2008, which is incorporated herein by reference.

BACKGROUND

To incorporate components as part of a mobile phone without increasing the phone size, a phone designer may wish to economize the surface area of a motherboard within the phone for mounting the components. To economize the surface area, certain components may be arranged as package-on-package (POP) stacks on the motherboard.

SUMMARY

According to one aspect, a package-on-package stack may include an upper package, an optical interface, and a lower package. The upper package may send an optical signal from a first component in the upper package. The optical interface may receive the optical signal from the upper package, and transmit the optical signal. The lower package may receive the optical signal from the optical interface, and relay the optical signal to a second component in the lower package.

Additionally, the second component may include a processor.

Additionally, the first component may include at least one of a processor or a memory.

Additionally, the upper package may include a substrate to which the first component is mounted.

Additionally, the upper package may include electrical contacts for delivering power to the first component.

Additionally, the package-on-package stack may further include a data bus that electrically couples the first component to the second component.

Additionally, the optical interface may be further configured to send optical signals to components of a device on which the package-on-package stack is installed.

Additionally, the optical interface may include routing paths for routing the optical signal.

Additionally, one of the routing paths may include a direct optical signal path from the first component to the second component and may not include an optical switch.

Additionally, the one of the routing paths may include one or more semiconductor nanophotonic optical switches.

Additionally, the one or more semiconductor nanophotonic optical switches may include a silicon nanophotonic optical switch.

Additionally, the optical interface may be further configured to select one of the routing paths for an optical signal.

Additionally, the optical interface may include an upper optical interface and a lower optical interface. The upper optical interface may receive the optical signal from the upper package, and transmit the received optical signal. The lower optical interface may receive the optical signal from the upper optical interface, and transmit the optical signal to the lower package.

Additionally, the optical signal may carry data from the first component to the second component.

According to another aspect, a method may include sending an optical signal from a component in an upper package of a package-on-package stack, and receiving, at an optical interface, the optical signal from the component in the upper package. The method may also include sending the signal from the optical interface to a lower package of the package-on-package stack, and receiving, at the lower package, the optical signal from the optical interface.

Additionally, the receiving, at an optical interface, may further include one of: receiving, at the optical interface, the optical signal that is normal to a surface of the component, the surface being parallel to a substrate's surface abutting the component; or receiving, at the optical interface, the optical signal that is parallel to a surface of the component, the surface being parallel to a substrate's surface abutting the component.

Additionally, the method may further include relaying electrical signals from the component to the lower package through a wire or a solder ball.

Additionally, the method may further include relaying the optical signal to a processor in the lower package.

Additionally, the method may further include routing the optical signal through optical switches in the optical interface.

According to yet another aspect, a device may include means for sending data, over optical signals, from one or more dies electrically coupled to one another by through-hole silicon vias in a upper package of a stacked structure. In addition, the device may further include means for receiving the optical signals from the dies, means for routing the received optical signals, and means for transmitting the routed optical signals to a die in a lower package of the stacked structure and relaying the data to the die.

BRIEF DESCRIPTION OF THE DRAWINGS

The accompanying drawings, which are incorporated in and constitute a part of this specification, illustrate one or more embodiments described herein and, together with the description, explain the embodiments. In the drawings.

DETAILED DESCRIPTION

The following detailed description refers to the accompanying drawings. The same reference numbers in different drawings may identify the same or similar elements.

In the following, a upper package and a lower package of a package-on-package (PoP) stack may communicate with one another via optical signals. By using the optical signals, the packages may communicate with one another at a greater bandwidth than packages that communicate via electrical wires and/or interconnects. In addition, the packages may consume less energy and may generate less heat. Furthermore, by using PoP stacks with optical signaling in place of PoP stacks with wires/interconnects, a number of electrical wires/interconnects coupling the packages to each other or to a motherboard may be reduced. Consequently, for PoP stacks with optical signaling, soldering processes in making the packages may be simplified, resulting in increased surface mount technology (SMT) yield.

Figure 1:
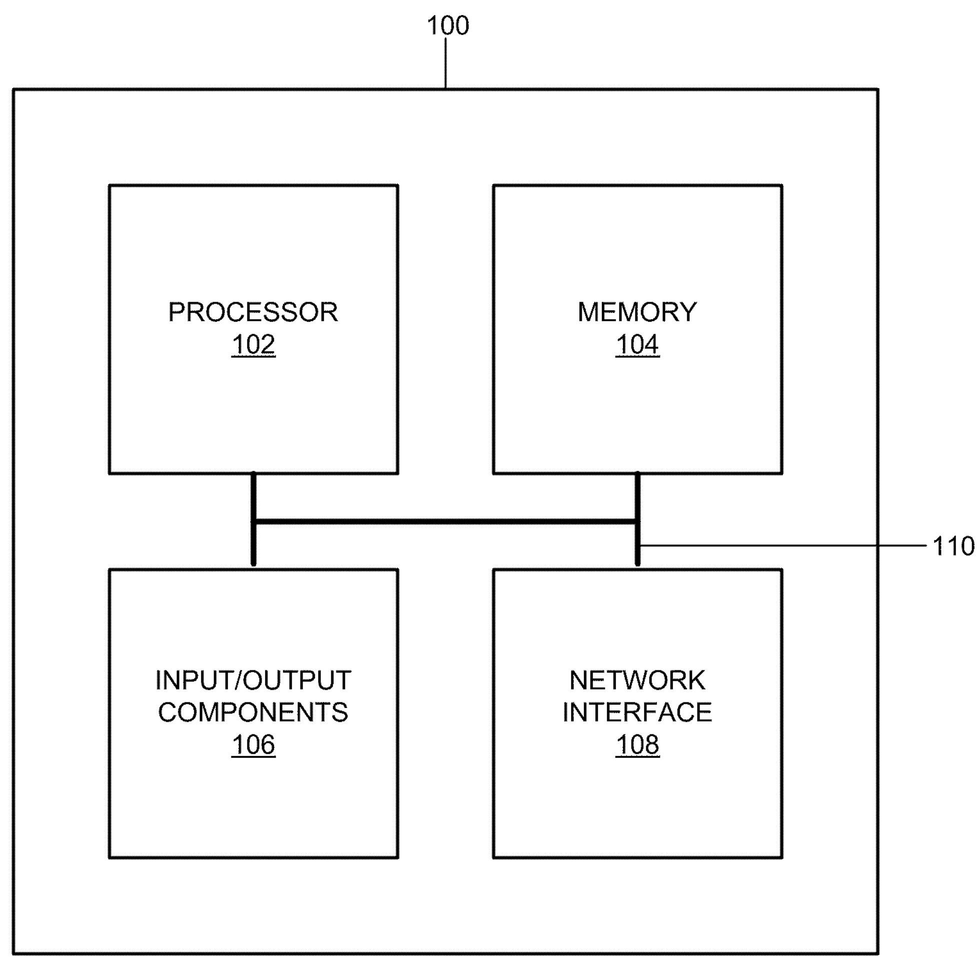
FIG. 1 is a block diagram of functional components of an exemplary device in which the concepts described herein may be implemented.

FIG. 1 is a block diagram of functional components of an exemplary device 100 in which the concepts described herein may be implemented. Device 100 may include any of the following devices: a radiotelephone or a mobile telephone; a personal communications system (PCS) terminal that may combine a cellular radiotelephone with data processing, facsimile, and/or data communications capabilities; an electronic notepad, a laptop, and/or a personal computer; a personal digital assistant (PDA) that can include a telephone; a gaming device or console; a peripheral (e.g., wireless headphone); a digital camera; or another type of computational or communication device.

As shown in FIG. 1, device 100 may include a processor 102, a memory 104, input/output components 106, a network interface 108, and a communication path 110. In different implementations, device 100 may include additional, fewer, or different components than the ones illustrated in FIG. 1. For example, device 100 may include additional network interfaces, such as interfaces for receiving and sending data packets.

Processor 102 may include a processor, a microprocessor, an Application Specific Integrated Circuit (ASIC), a Field Programmable Gate Array (FPGA), and/or other processing logic (e.g., audio/video processor) capable of processing information and/or controlling device 100. Memory 104 may include static memory, such as read only memory (ROM), and/or dynamic memory, such as random access memory (RAM), or onboard cache, for storing data and machine-readable instructions. Memory 104 may also include storage devices, such as a floppy disk, CD ROM, CD read/write (R/W) disc, and/or flash memory, as well as other types of storage devices.

Input/output components 106 may include a display screen, a keyboard, a mouse, a speaker, a microphone, a Digital Video Disk (DVD) writer, a DVD reader, Universal Serial Bus (USB) lines, and/or other types of components for converting physical events or phenomena to and/or from digital signals that pertain to device 100.

Network interface 108 may include any transceiver-like mechanism that enables device 100 to communicate with other devices and/or systems. For example, network interface 108 may include mechanisms for communicating via a network, such as the Internet, a terrestrial wireless network (e.g., a WLAN), a satellite-based network, a WPAN, etc. Additionally or alternatively, network interface 108 may include a modem, an Ethernet interface to a LAN, and/or an interface/connection for connecting device 100 to other devices (e.g., a Bluetooth interface).

Communication path 110 may provide an interface through which components of device 100 can communicate with one another.

Figures 2A, 2B:
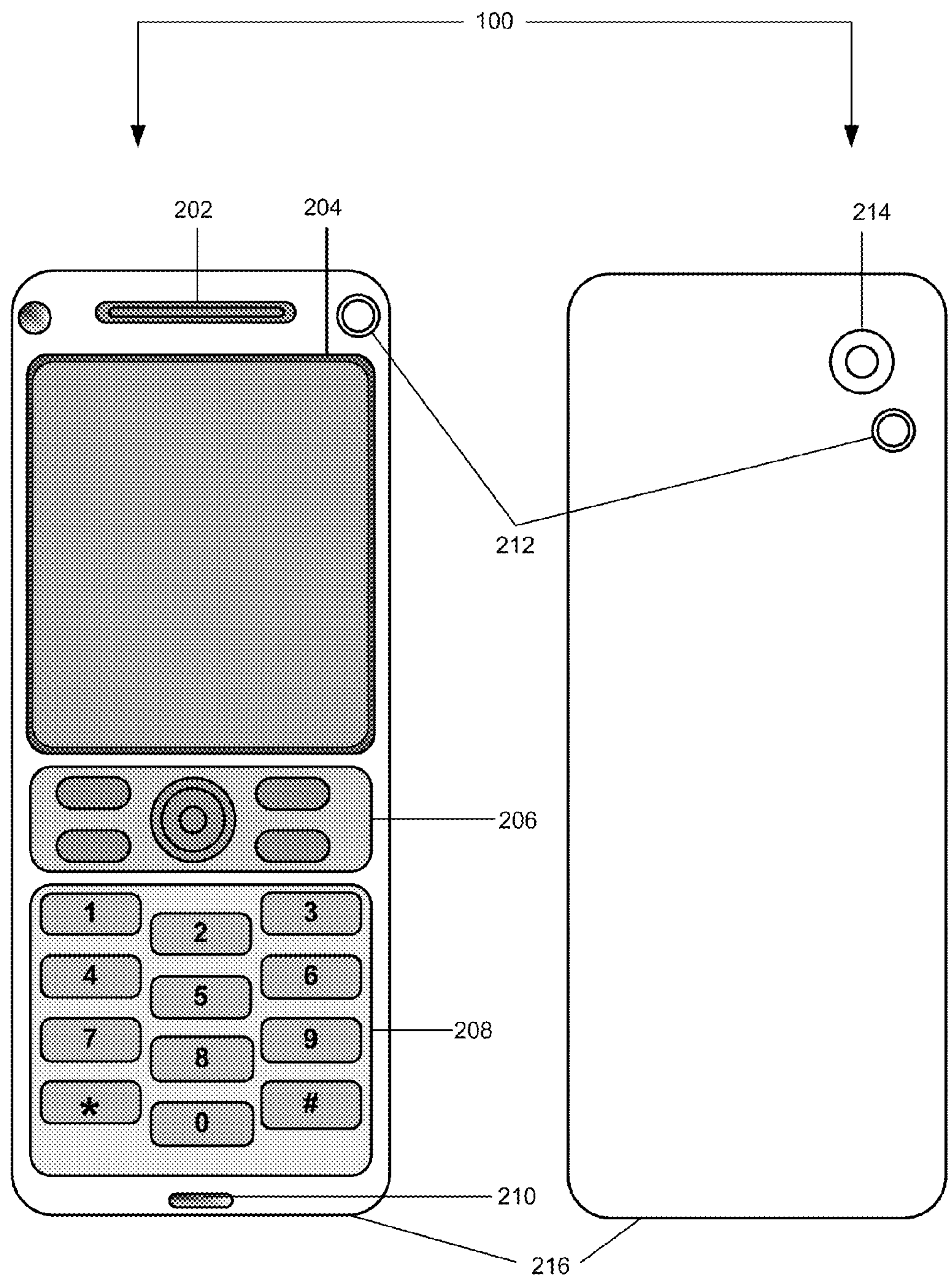
FIGS. 2A and 2B are front and rear views of one implementation of the device of FIG. 1.

FIGS. 2A and 2B are front and rear views, respectively, of one implementation of device 100. In this implementation, device 100 may take the form of a portable phone (e.g., a cell phone). As shown in FIGS. 2A and 2B, device 100 may include a speaker 202, a display 204, control buttons 206, a keypad 208, a microphone 210, sensors 212, a lens assembly 214, and a housing 216. Speaker 202 may provide audible information to a user of device 100. Display 204 may provide visual information to the user, such as an image of a caller, video images, or pictures. Control buttons 206 may permit the user to interact with device 100 to cause device 100 to perform one or more operations, such as place or receive a telephone call. Keypad 208 may include a standard telephone keypad. Microphone 210 may receive audible information from the user. Sensors 212 may collect and provide, to device 100, information (e.g., acoustic, infrared, etc.) that is used to aid the user in capturing images. Lens assembly 214 may include a device for manipulating light rays from a given or a selected range, so that images in the range can be captured in a desired manner. Housing 216 may provide a casing for components of device 100 and may protect the components from outside elements.

Figure 3:
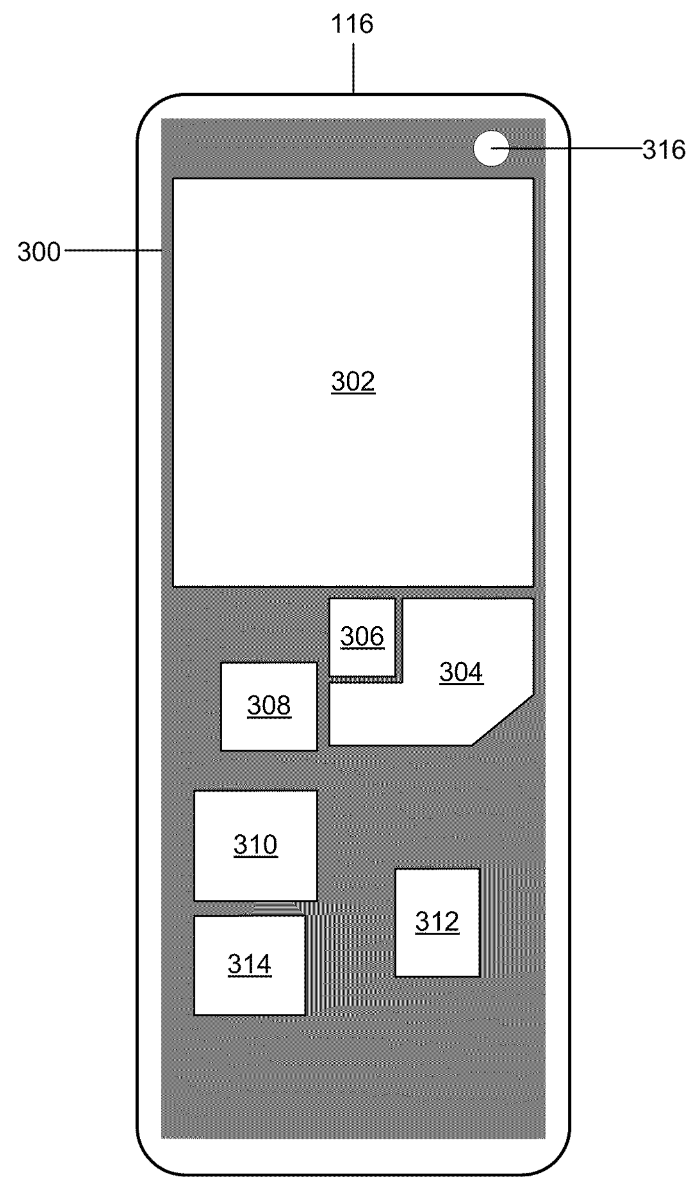
FIG. 3 is a block diagram of an exemplary motherboard of the device of FIGS. 2A and 2B.

In addition to the components 202-216, device 100 may also include, within device 100, a motherboard on which other components of device 100 may be mounted and electrically coupled. FIG. 3 is a block diagram of an exemplary motherboard 300 of device 100. As shown, motherboard 300 may include display back 302, a display control 304, a battery contact 306, a radio frequency (RF) unit 308, a PoP stack 310, a removable memory connector (e.g., a subscriber identity module (SIM) connector), an analog-to-digital (A/D) converter 314, and antenna 316. Depending on the implementation, motherboard 300 may include fewer, additional, or different components than those illustrated in FIG. 3.

Display back 302 may be the back of display 204 (FIG. 2), which protrudes through motherboard 300. Display control 304 may include a component for controlling various parameters related to display 204 (FIG. 2A) (e.g., brightness). Battery contact 306 may connect motherboard 300 to a battery that provides power to device 100. RF unit 308 may include a device for modulating/demodulating RF signals.

PoP stack 310 may include components, such as, for example, a processor and a memory, arranged in a vertical stack.

Removable memory connector 312 may include a connector for attaching a removable memory, such as a SIM card, to motherboard 300. A/D converter 314 may include a component for converting analog signals (e.g., audio signals) to digital signals for further processing. Antenna 316 may receive or transmit RF signals at/from device 10 from/to another device (e.g., a wireless access point). In some implementations, antenna 316 may be formed as a conductive trace on motherboard 300 or adjacent to motherboard.

Figure 4:
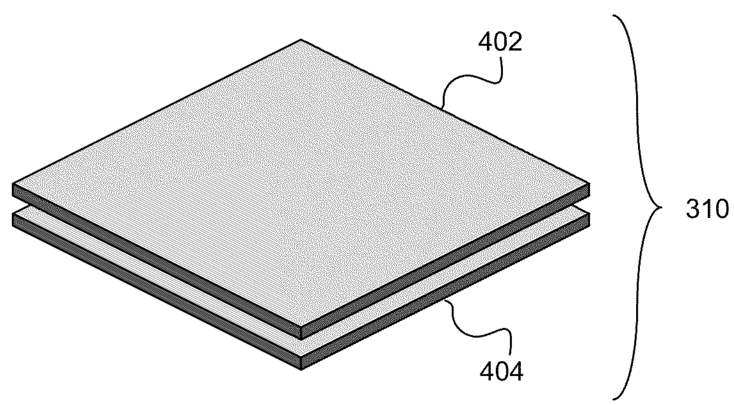
FIG. 4 shows a perspective view of an exemplary package-on-package (PoP) stack of FIG. 3.

FIG. 4 shows a perspective view of PoP stack 310. As shown, PoP stack 310 may include a upper package 402 and a lower package 404. Each of packages 402 and 404 may include one or more components of device 100. Lower package 404 may be mounted on a larger component, such as motherboard 300, and may provide signaling pathways between components of PoP stack 310 and other components of device 100.

Figure 5A:
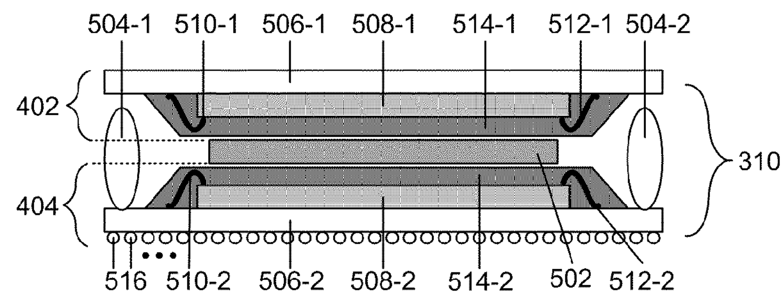
FIG. 5A shows a side view of one implementation of the PoP stack of FIG. 4.

FIG. 5A shows a side view of one implementation of PoP stack 310. As shown, PoP stack 310 may include upper package 402, lower package 404, an optical interface 502, and electrical contacts 504-1 and 504-2 (e.g., balls). Depending on the implementation, PoP stack 310 may include fewer, additional, or different components than those illustrated in FIG. 5A.

Optical interface 502 may provide optical signaling pathways between upper package 402 and lower package 404. Optical signals may convey data/information from a component in upper/lower package 402/404 to upper/lower package 404/402. Electrical contacts 504-1 and 504-2 may provide for power, ground, and/or signals between upper package 402 and lower package 404. In sending or receiving signals from upper package 402 via optical interface 502 or electrical contacts 504-1 and 504-2, lower package 404 may relay some of the signals to other components of device 100.

As further shown in FIG. 5A, upper package 402 may include a top substrate 506-1, a top die 508-1, wires 510-1 and 512-1, and molding 514-1. Top substrate 506-1 may provide a frame or panel to which top die 508-1 may be mounted or affixed. Top die 508-1 may include a component of device 100 (e.g., a memory, a processor, etc.).

Wires 510-1 and 512-1 may provide electrical conduits between top die 508-1 and electrical contacts 504-1 and 504-2. In some implementations, some of the signals to/from top die 508-1 may be accessed or provided via wires 510-1 and 512-1. In addition, wires 510-1 and 512-1 may provide power and/or ground contacts to top die 508-1. In a different implementation, instead being coupled to top substrate 506-1 by wires 510-1 and 512-1, top die 508-1 may be flip-chip mounted on top substrate 506-1. That is, top die 508-1 may be electrically coupled to parts of top substrate 506-1, by flipping top die 508-1 so that metal contacts on integrated circuits (not shown) of top die 508-1 face the bottom surface of top substrate 506-1, and by attaching the metal contacts to top substrate 506-1 via solder bumps (not shown).

Molding 514-1, which may be constructed from molding compound, may cover open surface areas of top die 508-1 to protect top die 508-1, wires 510-1, wires 512-1, etc., from possible touches, vibrations, etc.

As also shown in FIG. 5A, lower package 404 may include a bottom substrate 506-2, a bottom die 508-2, wires 510-2 and 512-2, and electrical contacts 516 (e.g., solder balls). Bottom substrate 506-2 may provide a frame to which bottom die 508-2 may be mounted or affixed. In addition, bottom substrate 506-2 may provide for electrical pathways between bottom die 508-2, electrical contacts 504-1 and 504-2, and other components of device 100. Bottom die 508-2 may include a component of device 100 (e.g., a processor). Wires 510-2 and 512-2 may provide electrical conduits between bottom die 508-2 and electrical contacts 516. In a different implementation, in place of wires 510-2 and 512-2, bottom die 508-1 may be flip-chip mounted on bottom substrate 506-2. Molding 514-2 may cover open surface areas of bottom die 508-2 to protect bottom die 508-2, wires 510-2, wires 512-2, etc., from possible touches, vibrations, etc.

Electrical contacts 516 may provide electrical pathways (e.g., power lines, ground, etc.) between lower package 404 and a device component to which bottom substrate 506-2 is attached.

Figure 5B:
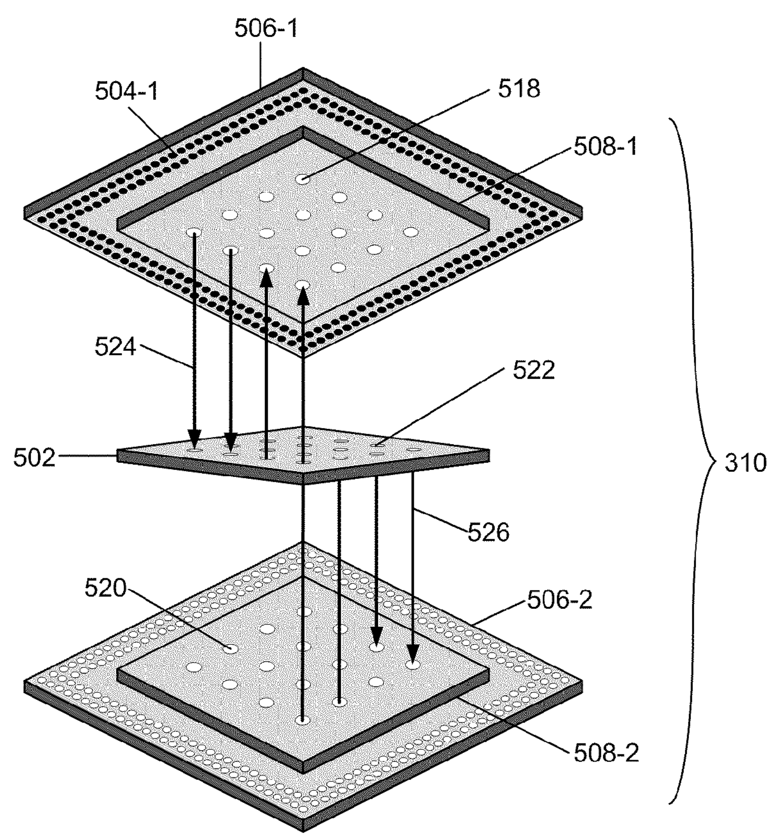
FIG. 5B shows perspective views of exemplary components of the PoP stack of FIG. 5A.

FIG. 5B shows perspective views of exemplary components of PoP stack 310 of FIG. 5A. As shown, the bottom surface of top die 508-1 may include optical ports, one of which is illustrated as optical port 518. Optical port 518 may receive or transmit optical signals into/from top die 508-1. The number and locations of optical ports on top die 508-1 may be implementation dependent, and may be different from those illustrated in FIG. 5B. Molding 514-1, which is not illustrated for the sake of simplicity in FIG. 5B, may include holes where the optical ports are located on the bottom surface of top die 508-1, so that optical signals may be transmitted and/or received at the optical ports.

As also shown, the top surface of bottom die 508-2 may include optical ports, one of which is illustrated as optical port 520. Optical port 520 may receive or transmit optical signals into/from bottom die 508-2. The number and locations of optical ports on bottom die 508-2 may be implementation dependent, and may be different from those illustrated in FIG. 5B. Moldings 514-2, which is not illustrated for the sake of simplicity in FIG. 5B, may include holes where the optical ports are located on the top surface of bottom die 508-2, so that optical signals may be transmitted and/or received at the optical ports.

As further shown, the top surface of optical interface 502 may include optical ports, one of which is shown as optical port 522. The bottom surface of optical interface 502 may also include optical ports, but they are not shown in FIG. 5B.

When optical interface 502 receives an optical signal via one of optical ports on the top/bottom surface, optical interface 502 may route the optical signal through optical switches (e.g., one or more optical silicon nanophotonic switches) within optical interface 502 and emit the signal on a corresponding optical port on the opposite surface. For example, optical interface 502 may receive optical signal 524 from top die 508-1, route, and emit optical signal 526 to bottom die 508-2.

An optical port on one surface of optical interface 502 may be positioned to match an optical port on top die 508-1, and an optical port on another surface of optical interface 502 may be positioned to match an optical port on bottom die 508-2. Such an arrangement may allow optical interface 502 to route optical signals from a specific port on top die 508-1/bottom die 508-2 to a specific optical port on bottom die 508-2/top die 508-1. In some implementations, where specific optical ports on top die 508-1 align with optical ports on bottom die 508-2, optical interface 502 may pass or route optical signals from top die 508-1/bottom die 508-2 directly to bottom die 508-2/top die 508-1 without passing the optical signals through optical switches.

In implementing optical interface 502, the locations of optical ports in top die 508-1, bottom die 508-2, and optical interface 502 may be determined in accordance with one or more standards (e.g., Joint Electron Device Engineering Council (JEDEC) standards). In some implementations, it may be possible to configure top die 508-1, bottom die 508-2, and/or optical interface 502, such that an optical signal is output/input via a specific optical port. For instance, given optical interface 502, it may be possible to select and set a routing path for an optical signal, among many possible paths, from a specific optical input port to a specific output port. Such configurability may be helpful in aligning optical ports on top die 508-1, bottom die 508-2, and/or optical interface 502 during construction of PoP stack 310.

Figure 6A:
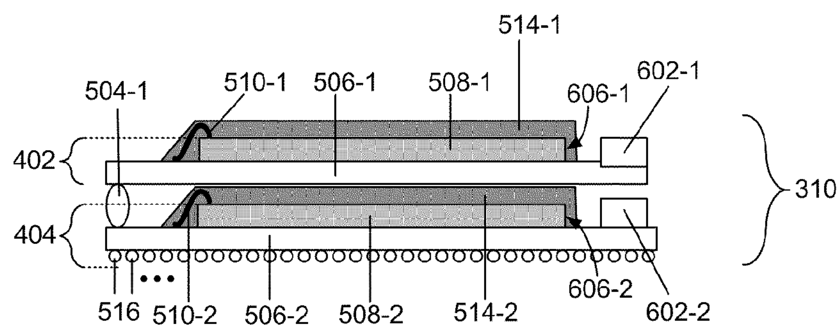
FIG. 6A shows a side view of another implementation of the PoP stack of FIG. 4.

FIG. 6A shows a side view of another implementation of PoP stack 310. In PoP stack 310 of FIG. 6A, top and bottom dies 508-1 and 508-2 may emit or receive optical signals via optical ports on side surfaces. As described above, in PoP stack 310 of FIG. 5A, top and bottom dies 508-1 and 508-2 may emit or receive optical signals at the bottom and top surfaces, respectively.

In order to accommodate transmission/reception of optical signals at a side of top die 508-1 or a side of bottom die 508-2, PoP stack 310 in FIG. 6A may include optical interfaces 602-1 and 602-2 that may be located at a side of top die 508-1 or a side of bottom die 508-2. Optical interfaces 602-1 and 602-2 may route optical signals from top die 508-1 to bottom die 508-2, as does optical interface 502. However, as shown in FIG. 5A, optical interface 502 may be located between upper package 402 and lower package 404.

PoP stack 310 of FIG. 6A may be different from PoP stack 310 of FIG. 5A in a number of ways. For example, in FIG. 6A, a top die 508-1's surface that is not affixed to top substrate 506-1 may be facing away from lower package 404. In FIG. 5A, a top die 508-1's surface that is not affixed to top substrate may be facing toward lower package 404. In a sense, upper package 402 in FIG. 5A and that in FIG. 6A may be oriented differently, opposite each other in a direction perpendicular to the top/bottom surfaces of top die 508-1 and bottom die 508-2.

In FIG. 6A, moldings 514-1 and 514-2 may provide for openings on side surfaces 606-1 and 606-2 to allow optical signals to be emitted and/or received at optical ports at side surfaces 606-1 and 606-2.

Figure 6B:
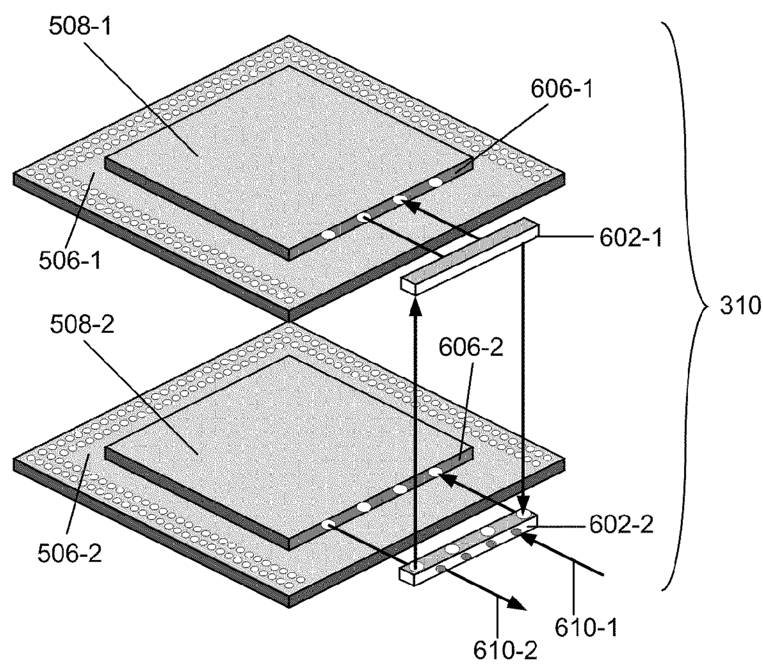
FIG. 6B shows perspective views of exemplary components of the PoP stack of FIG. 6A.

FIG. 6B shows perspective views of exemplary components of PoP stack 310 of FIG. 6A. For the purpose of simplicity, FIG. 6B does not illustrate a number of features shown in FIG. 6A. As shown, side surface 606-1 of top die 508-1 may include optical ports, and side surface 606-2 of bottom die 508-2 may include optical ports.

In FIG. 6B, optical interface 602-1 and 602-2's side surfaces that face side surfaces 606-1 and 606-2 of top and bottom dies 508-1 and 508-2 may include optical ports. When optical interface 602-1 receives an optical signal via an optical port, optical interface 602-1 may route the optical signal through optical switches (e.g., optical nanophotonic switches) within optical interface 602-1 and emit the optical signal to optical interface 602-2 via an optical port on the bottom surface of optical interface 602-1. Optical interface 602-2, upon receiving the optical signal, may route the optical signal through optical switches and emit the signal to an optical port on side surface 606-2 of bottom die 508-2. In some implementations, optical interface 602-2 may emit/receive optical signals to/from other components of device 100, as shown by arrows 610-1 and 610-2.

Figure 7A:
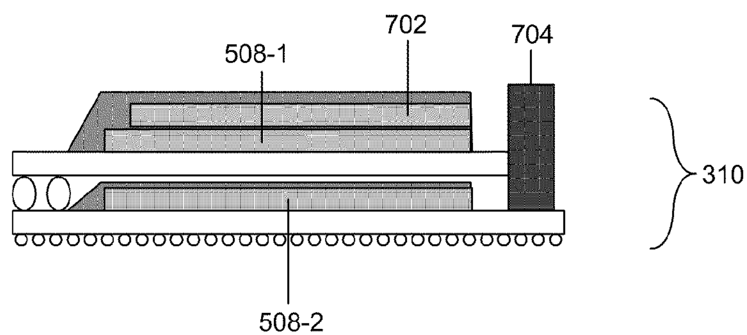
FIG. 7A shows a side view of yet another implementation of the PoP stack of FIG. 4.

FIG. 7A shows a side view of yet another implementation of PoP stack 310. For the purpose of simplicity in illustration, FIG. 7A does not show labels of many components that are as same as those of FIG. 6A. In contrast to PoP stack 310 of FIG. 6A, PoP stack 310 in FIG. 7A may include multiple dies that are stacked. For example, top package 402 may include top die 702 in addition to top die 508-1. The multiple dies may be flip-chip mounted and electrically coupled via solder balls. In a different implementation, the multiple dies may be electrically coupled by through-hole silicon vias (TSVs). That is, electrical contacts from top die 508-1 may be connected through vias (e.g., holes) in the body of top die 702, and electrically couple to top die 508-1 to top die 702. Such an arrangement may provide communication paths, power lines, ground contacts, etc.

In PoP stack 310 of FIG. 7A, optical interface 704 may be used instead of optical interfaces 602-1 and 602-2 in FIG. 6A. In FIG. 7A, optical interface 704 may route optical signals from top die 508-1, top die 702, and bottom die 508-2 in place of two optical interface 602-1 and 602-2.

Figure 7B:
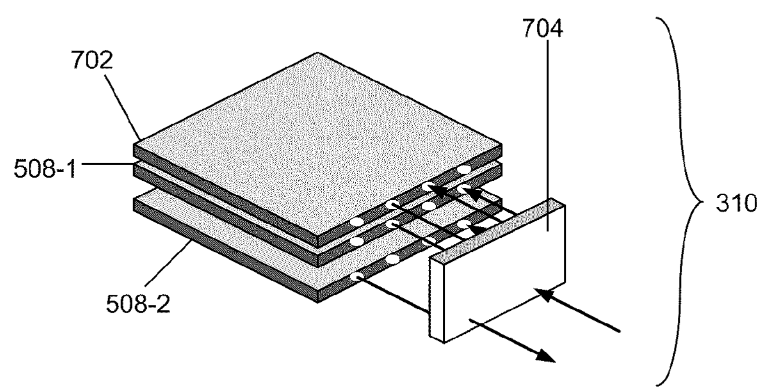
FIG. 7B shows perspective views of exemplary components of the PoP stack of FIG. 7A.

FIG. 7B shows perspective views of top die 508-1, top die 702, bottom die 508-2, and optical interface 704 of FIG. 7A. When optical interface 704 receives an optical signal via an optical port, optical interface 704 may route the optical signal through optical switches within optical interface 704 and transmit the signal to an optical port. In addition, optical interface 704 may emit/receive optical signals to/from other components of device 100.

Exemplary Processes for Optical Signaling

Figure 8:
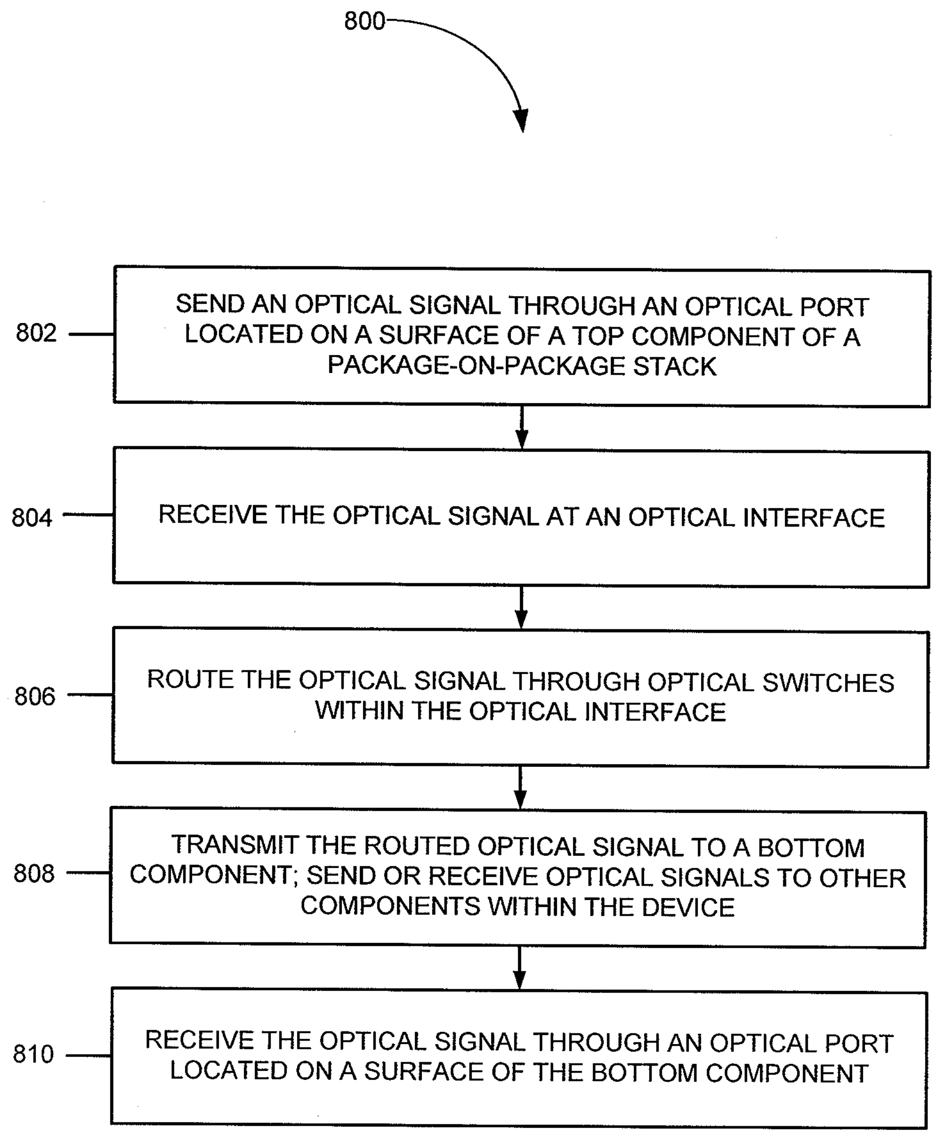
FIG. 8 is a flow diagram of a process for routing signal from an exemplary upper package to a lower package of the PoP stack of FIG. 4.

FIG. 8 is flow diagram of an exemplary process 800 for optical signaling between upper package 402 and lower package 404 of PoP stack 310. Assume that device 100 is turned on, and components (e.g., top die 508-1 and bottom die 508-2) in PoP stack 310 are operating.

Process 800 may begin at block 802, where an optical signal may be sent through an optical port located on a surface of a top component of a PoP stack (block 802). For example, a top die 508-1 (e.g., which may include a memory or a processor) may send an optical signal through optical port 516.

The optical signal may be received at an optical interface of PoP stack 310 (block 804). For example, the optical signal from a memory may be received at optical interface 502.

The optical signal may be routed through optical switches within the optical interface of PoP stack 310 (block 806). The optical interface (e.g., optical interface 502, 602-1, 602-2, 702, etc.) may route the optical signal to deliver the optical signal to an output optical port.

The routed optical signal may be transmitted to a bottom component of PoP stack 310 (block 808). For example, the optical interface may transmit the routed optical signal to bottom die 508-2 (e.g., which may include a processor, a memory, etc.). In some implementations, the optical interface may also transmit the routed optical signal to other components of device 100.

At block 810, the transmitted optical signal may be received through an optical port located on a surface of the bottom component (block 810).

In the above, by using optical signals, upper and lower packages 402 and 404 may communicate with one another at a high bandwidth. In a PoP stack whose upper package and lower package communicate via electrical wires, electrical signals from a bottom die (e.g., a processor) may be routed via a bond-wire to a bottom substrate, through a solder-joint connecting the bottom substrate to a top substrate, and the top substrate to a bond wire connected to a top die (e.g., a memory). Sending electrical signals through such long paths may be slow, consume a lot of energy, and generate heat that causes degradations in performance of components in the top and lower packages. In addition, a large number of wires and/or solder balls in the PoP stack may complicate the design of the SMT assembly.

By using optical signaling, the packages may consume less energy and generate less heat. In addition, by using PoP stacks with optical signaling in place of PoP stacks with wires/interconnects, components in the upper and lower packages may communicate at higher speeds. Furthermore, the design of the SMT assembly may be simplified and may provide for a higher SMT yield.

Conclusion

The foregoing description of implementations provides illustration, but is not intended to be exhaustive or to limit the implementations to the precise form disclosed. Modifications and variations are possible in light of the above teachings or may be acquired from practice of the teachings. For example, while implementations have been described herein with respect to PoP stacks, other types of stacked structures that requires stack-to-stack communication may be implemented based on optical signaling.

In the above, while a series of blocks has been described with regard to the exemplary processes illustrated in FIG. 8, the order of the blocks may be modified in other implementations. In addition, non-dependent blocks may represent acts that can be performed in parallel to other blocks.

It will be apparent that aspects described herein may be implemented in many different forms of software, firmware, and hardware in the implementations illustrated in the figures. The actual software code or specialized control hardware used to implement aspects does not limit the invention. Thus, the operation and behavior of the aspects were described without reference to the specific software code—it being understood that software and control hardware can be designed to implement the aspects based on the description herein.

It should be emphasized that the term "comprises/comprising" when used in this specification is taken to specify the presence of stated features, integers, steps or components but does not preclude the presence or addition of one or more other features, integers, steps, components, or groups thereof.

Further, certain portions of the implementations have been described as "logic" that performs one or more functions. This logic may include hardware, such as a processor, a microprocessor, an application specific integrated circuit, or a field programmable gate array, software, or a combination of hardware and software.

Even though particular combinations of features are recited in the claims and/or disclosed in the specification, these combinations are not intended to limit the invention. In fact, many of these features may be combined in ways not specifically recited in the claims and/or disclosed in the specification.

No element, act, or instruction used in the present application should be construed as critical or essential to the implementations described herein unless explicitly described as such. Also, as used herein, the article "a" is intended to include one or more items. Where one item is intended, the term "one" or similar language is used. Further, the phrase "based on" is intended to mean "based, at least in part, on" unless explicitly stated otherwise.

What is claimed is:

1. A method comprising:

receiving, from a first package of a package-on-package stack and by a first optical interface of the package-on-package stack, an optical signal;

wherein the optical interface is located on an upper surface of a second package of the package-on-package stack;

transmitting, by the optical interface of the package-on-package stack, the optical signal to the second package;

wherein the first optical interface comprises routing paths for routing optical signals between the first package and the second package;

selecting, by the first optical interface, a routing path from the routing paths;

wherein the optical signal is transmitted to the second package using the selected routing path;

receiving, by the second package of the package-on-package stack, the optical signal transmitted by the first optical interface;

wherein the optical signal received by the first optical interface comprises data from a first component associated with the first package; and transmitting the optical signal that is received by the second package and comprises the data to a second component associated with the second package.

2. A method comprising:

receiving, from a first package of a package-on-package stack and by an optical interface of the package-on-package stack, an optical signal;

wherein the optical interface is located on an upper surface of a second package of the package-on-package stack;

transmitting, by the optical interface of the package-on-package stack, the optical signal to the second package;

receiving, by the second package of the package-on-package stack, the optical signal transmitted by the optical interface;

wherein the optical interface is further located on a side surface of the first package;

wherein the optical signal received by the optical interface comprises data from a first component associated with the first package; and transmitting the optical signal that is received by the second package and comprises the data to a second component associated with the second package.

3. The method of claim 1, further comprising:

receiving, by an electrical contact of the package-on-package stack, an electrical signal from the first package;

wherein the electrical contact is physically separate from the first optical interface; and transmitting, by the electrical contact, the received electrical signal to the second package.

4. The method of claim 1, wherein a second optical interface is located on a upper surface of the first package; and wherein the second optical interface is different from the first optical interface.

5. A method comprising:

receiving, from a first package of a package-on-package stack and by a first optical interface of the package-on-package stack, an optical signal;

wherein the first optical interface is located on an upper surface of a first package of the package-on-package stack;

transmitting, by the first optical interface of the package-on-package stack, the optical signal to a second optical interface of the package-on-package stack;

wherein the second optical interface is located on an upper surface of a second package;

wherein the second optical interface is different from the first optical interface;

transmitting, by the second optical interface of the package-on-package stack, the optical signal to the second package.

6. The method of claim 1, further comprising:

transmitting, by the second package, a second optical signal that comprises data from a third component associated with the second package;

receiving, by the first optical interface, the second optical signal; and transmitting, by the first optical interface, the second optical signal to the first package.

7. A device comprising:

a package-on-package stack comprising a first package and a second package, the first package being associated with a first component and the second package being associated with a second component, the package-on-package stack further comprising:

an optical interface to:

receive, from the first package of the package-on-package stack, a signal that comprises data from the first component associated with the first package;

transmit the signal to the second package of the package-on-package stack;

wherein the optical interface is located on a side surface of the first package and an upper surface of the second package; and wherein the signal, including the data, is transmitted to the second component associated with the second package.

8. The device of claim 7, wherein the first package comprises a first optical port and the optical interface comprises a second optical port;

wherein the signal comprises an optical signal;

wherein the optical signal is received from the first optical port associated with the first package; and wherein the optical signal is transmitted to the second package from the second optical port associated with the optical interface.

9. The device of claim 7, wherein the second package is to transmit a second optical signal that comprises second data from a third component associated with the second package; and wherein the optical interface is to:

receive the second optical signal; and transmit the second optical signal to the first package.

10. The device of claim 7, where the optical interface comprises routing paths; and wherein the optical interface is to:

select a particular routing path from the routing paths, and transmit the signal using the selected particular routing path.

11. The device of claim 10, wherein one or more of the routing paths comprises at least one of a nanophotonic optical switch or a silicon nanophotonic optical switch.

12. The device of claim 7, wherein the package-on-package stack further comprises an electrical contact; and wherein the electrical contact is to:

receive an electrical signal from the first package; and transmit the received electrical signal to the second package.

13. The device of claim 12, wherein the second package is to:

receive the electrical signal; and transmit the electrical signal to a third component of the second package.

14. A package-on-package stack, comprising:

a first package to transmit an optical signal;

a second package;

an optical interface to:

receive the optical signal transmitted by the first package;

transmit the received optical; and wherein the optical interface is located on a side surface of the first package and an upper surface of the second package of the package-on-package stack;

wherein the second package receives the optical signal transmitted by the optical interface; and wherein the second package is different from the first package.

15. The package-on-package stack of claim 14, wherein the optical interface comprises a first optical port and a second optical port;

wherein the optical interface includes a plurality of routing paths;

wherein the optical interface is to:

select a routing path from the plurality of routing paths, route, via the selected routing path, the optical signal from the first optical port, of the optical interface, to the second optical port, of the optical interface; and wherein the second optical port is different from the first optical port.

16. The package-on-package stack of claim 15, wherein, when transmitting the received optical signal, the optical interface is to:

transmit the optical signal, from the second optical port, to the second package.

17. The package-on-package stack of claim 14, wherein the first package is associated with a first component and the second package is associated with a second component and a third component;

wherein the optical signal, received by the second package, includes data from the first component;

wherein the optical signal, including the data, is transmitted to the second component associated with the second package; and wherein the optical interface is further to:

receive, from the second package, a second optical signal that includes second data from a third component associated with the second package; and transmit the second optical signal to the first package.

18. The package-on-package stack of claim 14, wherein the first package comprises a first optical port and the second package comprises a second optical port;

wherein, when transmitting the optical signal, the first package is to transmit the optical signal from the first optical port of the first package; and wherein, when receiving the optical signal, the second package is to receive the optical signal at the second optical port of the second package.

* * * * *